(12) United States Patent
Koo

(10) Patent No.: US 8,339,880 B2
(45) Date of Patent: Dec. 25, 2012

(54) CIRCUIT FOR CONTROLLING REDUNDANCY IN SEMICONDUCTOR MEMORY APPARATUS

(75) Inventor: Cheul Hee Koo, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 129 days.

(21) Appl. No.: 13/036,478

(22) Filed: Feb. 28, 2011

(65) Prior Publication Data

US 2011/0149665 A1 Jun. 23, 2011

Related U.S. Application Data

(63) Continuation-in-part of application No. 12/345,796, filed on Dec. 30, 2008, now abandoned.

(30) Foreign Application Priority Data

Feb. 22, 2008 (KR) .................. 10-2008-0016253

(51) Int. Cl.
*G11C 7/00* (2006.01)
(52) U.S. Cl. .............. 365/201; 365/200; 365/225.7
(58) Field of Classification Search .......... 365/201, 365/200, 225.7
See application file for complete search history.

(56) References Cited

U.S. PATENT DOCUMENTS

| | | | | |
|---|---|---|---|---|
| 6,078,543 A * | 6/2000 | Kim | .................. | 365/230.03 |
| 6,363,021 B2 * | 3/2002 | Noh | .................. | 365/200 |
| 6,498,756 B2 | 12/2002 | Lee | | |
| 6,704,226 B2 | 3/2004 | Lee | | |
| 2004/0088612 A1 * | 5/2004 | Seong | .................. | 714/710 |
| 2007/0081413 A1 * | 4/2007 | Koo | .................. | 365/230.06 |

FOREIGN PATENT DOCUMENTS

| | | |
|---|---|---|
| JP | 2002-334594 A | 11/2002 |
| KR | 10-0197990 B1 | 2/1999 |
| KR | 1020070040745 A | 4/2007 |
| KR | 1020070062815 A | 6/2007 |
| KR | 10-0821583 B1 | 4/2008 |
| WO | 01/59579 A1 | 8/2001 |

OTHER PUBLICATIONS

USPTO OA mailed May 27, 2010 in connection with U.S. Appl. No. 12/345,796.
USPTO OA mailed Nov. 10, 2010 in connection with U.S. Appl. No. 12/345,796.

* cited by examiner

*Primary Examiner* — Jason Lappas
(74) *Attorney, Agent, or Firm* — Ladas & Parry LLP

(57) ABSTRACT

Disclosed are a circuit and a method for controlling redundancy in a semiconductor memory apparatus. The circuit includes a peripheral circuit redundancy control block and a memory bank redundancy control block. The peripheral circuit redundancy control block buffers and latches an external command to generate an internal command. The peripheral circuit redundancy control block also buffers and latches an external address to generate a global address by comparing the external address with a predetermined output signal of a fuse circuit. The memory bank redundancy control block receives the global address corresponding to the internal command to selectively activate a redundancy word line or a main word line, such that the fuse circuit is provided in the peripheral circuit redundancy control block.

15 Claims, 6 Drawing Sheets

CIRCUIT FOR CONTROLLING REDUNDANCY IN SEMICONDUCTOR MEMORY APPARATUS

CROSS-REFERENCES TO RELATED APPLICATION

This application is a continuation-in-part of application Ser. No. 12/345,796, filed on Dec. 30, 2008, titled "Circuit and Method for Controlling Redundancy in Semiconductor Memory Apparatus", which is incorporated here in by reference in its entirety as if set forth in full, and which claims priority under 35 U.S.C. §119(a) to Korean application number 10-2008-0016253, filed on 22 Feb. 2008, which is incorporated by reference in its entirety as if set forth in full.

BACKGROUND OF THE INVENTION

The present invention relates to a circuit for controlling redundancy in a semiconductor memory apparatus. More particularly, the present invention relates to a circuit for controlling redundancy in a semiconductor memory apparatus which is capable of increasing an area margin.

Generally, a semiconductor memory apparatus includes many memory cells. If any one of such memory cells is defective, then the entire semiconductor memory apparatus may operate in error. Recent developments in a semiconductor memory apparatus employs a redundancy control circuit which previously recognizes a defected cell through a test and then switches to a cell belonging to a redundancy circuit instead of the defected cell if an access to the defected cell is requested. The redundancy circuit refers to a set of redundant memory cells additionally provided in a memory cell array and which provides a substitute replacement cell for the defected cell.

Meanwhile, the semiconductor memory apparatus is mainly divided into a core circuit area and a peripheral circuit area. The core circuit area includes a plurality of memory banks, and each memory bank includes a plurality of memory cells for storing data. The peripheral circuit area includes auxiliary circuits to control the operation of the core circuit area and which performs a variety of functions such as the setting of an operational mode, power control, and timing control between a clock and data.

The redundancy circuit is provided in the memory bank of the core circuit area, and the operation of the redundancy circuit is determined in accordance to the cut state of a set of existing fuses.

A circuit to control the typical redundancy circuit includes a peripheral circuit redundancy control block 10 and a memory bank redundancy control block 20 as shown in FIG. 1.

The peripheral circuit redundancy control block 10 includes an address buffer unit 110, a command buffer unit 120, a first flip-flop unit 130, a second flip-flop unit 140, a global address generating unit 150, and a command converting unit 160.

The address buffer unit 110 buffers an external address add_ext<1:n> to output a buffering address add_buf<1:n>. The command buffer unit 120 buffers an external command cmd_ext to output a buffering command cmd_buf. The first flip-flop unit 130 latches the buffering address add_buf<1:n> under the control of a clock clk. The second flip-flop unit 140 latches the buffering command cmd_buf under the clock clk. The global address generating unit 150 receives a latch address add_lat<1:n> output from the first flip-flop unit 130, a first internal command cmd_int1 output from the second flip-flop unit 140, and a refresh signal rfsh to generate a global address add_glb<1:n>. The command converting unit 160 receives a bank address add_bnk<1:m> and receives the first internal command cmd_int1 to generate a second internal command cmd_int2.

The memory bank redundancy control block 20 includes a local address generating unit 210, a fuse set unit 220, a delay unit 230, a redundant decoding unit 240, and a main decoding unit 250.

The local address generating unit 210 generates a local address add_loc<1:n> from the global address add_glb<1:n> corresponding to the input of the second internal command cmd_int2. The fuse set unit 220 receives the local address add_loc<1:n> and compares the local address add_loc<1:n> with output signals of a plurality of existing fuse circuits to generate a repair determination signal rpa. The delay unit 230 delays the local address add_loc<1:n> by a predetermined time to output a delay local address add_locd<1:n>. The redundant decoding unit 240 decodes the delay local address add_locd<1:n> in accordance to the enable state of the repair determination signal rpa to activate any one redundancy word line RWL. The main decoding unit 250 decodes the delay local address add_locd<1:n> in accordance to the enable state of the repair determination signal rpa to activate any one main word line MWL.

The "n" and "m" representing each address bit number are positive integers. The "n" may be identical to or different from the "m". In other words, the first flip-flop unit 130 includes n flip-flop circuits, and the buffering address add_buf<1:n> is latched in each flip-flop circuit by one bit.

The external command cmd_ext is input to indicate an active mode of the semiconductor memory apparatus, and the refresh signal rfsh is generated by decoding a refresh command.

The global address generating unit 150 generates the global address add_glb<1:n> from latch address add_lat<1:n> in accordance to the indication of the first internal command cmd_int1. In addition, the command converting unit 160 generates the second internal command cmd_int2 by converting the first internal command cmd_int1 and delivers the second internal command cmd_int2 to a memory bank indicated by the bank address add_bnk<1:m>.

Generally, since the semiconductor memory apparatus includes a plurality of memory banks, the plural memory bank redundancy control blocks 20 exist by the number of the memory banks. The second internal command cmd_int2 indicates the operation of any one of the local address generating units 210 provided in the plural memory bank redundancy control blocks 20. The local address generating units 210, which is selected by the second internal command cmd_int2, receives the global address add_glb<1:n> to generate the local address add_loc<1:n>.

The fuse set unit 220 includes n fuse circuits, and the n fuse circuits generate signals in accordance to the connection or disconnection of fuses that is set in a test step. If the local address add_loc<1:n> is input into the n fuse circuits of the fuse set unit 220 in an active mode, then the fuse set unit 220 compares an output signal of the fuse circuit with the local address add_loc<1:n> by one bit to generate the repair determination signal rpa. The repair determination signal rpa activates the redundant decoding unit 240 or the main decoding unit 250 in accordance to the potential level thereof. For example, if the potential of the repair determination signal rpa is a high level, the repair determination signal rpa activates the redundant decoding unit 240. If the potential of the repair determination signal rpa is a low level, the repair determination signal rpa activates the main decoding unit 250.

The delay unit 230 is provided to synchronize timing to input the local address add_loc<1:n> to the redundant decoding unit 240 and the main decoding unit 250, with timing to deliver the repair determination signal rpa to the redundant decoding unit 240 and the main decoding unit 250. Thereafter, the redundant decoding unit 240 activated by the repair determination signal rpa activates a predetermined redundancy word line RWL based on the local address add_loc<1:n>. Similarly, the main decoding unit 250 activated by the repair determination signal rpa activates a predetermined main word line MWL based on the local address add_loc<1:n>.

As described above, the typical semiconductor memory apparatus includes a redundancy control circuit to replace a defected memory cell with a redundancy cell.

However, in the redundancy control circuit of the typical semiconductor memory apparatus, the fuse set unit 220 is provided in the memory bank redundancy control block 20, so that the area margin of the fuse set unit 220 may be reduced.

Generally, fuse cutting must be performed using a laser in a fuse circuit after the fuse circuit is designed. Accordingly, a predetermined area margin must be ensured for the fuse cutting. Therefore, since the fuse set unit 220 must have a predetermined area, it is difficult to reduce the area of the fuse set unit 220.

In addition, since the fuse set unit 220 is installed in a memory bank having a relatively insufficient available area as compared with that of the peripheral circuit region, the high integration of the semiconductor memory apparatus cannot be fully realized.

SUMMARY OF THE INVENTION

Embodiments of the present invention are directed to providing a circuit and a method for controlling redundancy in a semiconductor memory apparatus, capable of increasing an area margin of a memory bank region.

In one embodiment, a circuit for controlling redundancy in a semiconductor memory apparatus includes a peripheral circuit redundancy control block which buffers and latches an external command to generate an internal command, and buffers and latches an external address to generate a global address by comparing the external address with a predetermined output signal of a fuse circuit, and a memory bank redundancy control block which receives the global address corresponding to the internal command to selectively activate a redundancy word line or a main word line, wherein the fuse circuit is provided in the peripheral circuit redundancy control block.

In another embodiment, a circuit for controlling redundancy in a semiconductor memory apparatus includes a fuse set unit which compares a first latch address, which is obtained by buffering and latching an external address, with an output signal of each fuse circuit to generate a repair determination signal, a global address generating unit which receives a second latch address, which is obtained by buffering and latching the external address, and the output signal of each fuse circuit of the fuse set unit to generate a global address based on the repair determination signal, a first internal command, and a refresh signal, a local address generating unit which generates a local address from the global address corresponding to a second internal command, a redundant decoding unit which activates a redundancy word line in accordance to indication of the local address, and a main decoding unit which activates a main word line in accordance to the indication of the local address.

In further another embodiment, a method for controlling redundancy in a semiconductor memory apparatus includes of comparing an address delivered from an exterior and an output signal of a plurality of fuse circuits having preset fuse short information to generate a repair determination signal, receiving a first latch address, which is obtained by buffering and latching an external address with the output signal of each fuse circuit of a fuse set unit to generate a global address in accordance to the repair determination signal, a first internal command, and a refresh signal; generating a local address from the global address corresponding to input of a second internal command; and activating a redundancy word line or a main word line in accordance to indication of the local address.

The global address includes information about a repair operation state, the generating of the repair determination signal and the global address are performed in a peripheral area, and the generating of the local address and the activating of the redundancy word line or the main word line are performed in a memory bank area.

In still another embodiment, a circuit for controlling redundancy in a semiconductor memory apparatus includes a peripheral circuit redundancy control block which includes a main fuse set unit determining a redundancy state in accordance to a defect state of a main cell obtained from each fuse information, and the peripheral circuit redundancy control block generates a signal having information about the redundancy state, and a memory bank redundancy control block which includes an auxiliary fuse set unit determining a defect state of a redundancy cell for substitute for a main cell in accordance to the signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF THE PREFERRED EMBODIMENTS

Hereinafter, the present invention will be described in detail through embodiments. The embodiments are just for exemplifying the present invention, and the scope of right to be protected of the present invention is not limited by them.

Figure 1:
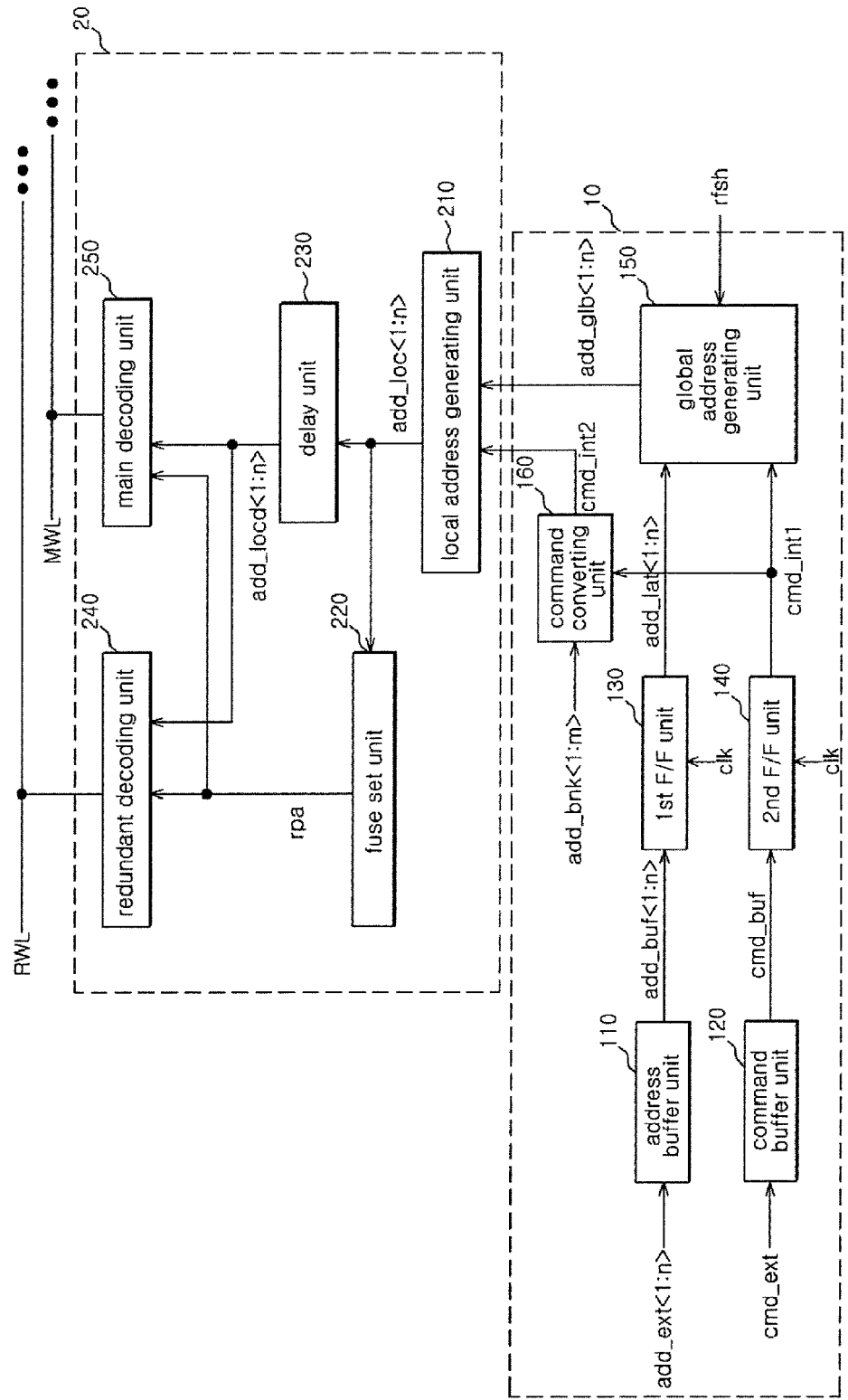
FIG. 1 is a block diagram showing a redundancy control circuit of a semiconductor memory apparatus according to the related art.
Figure 2:
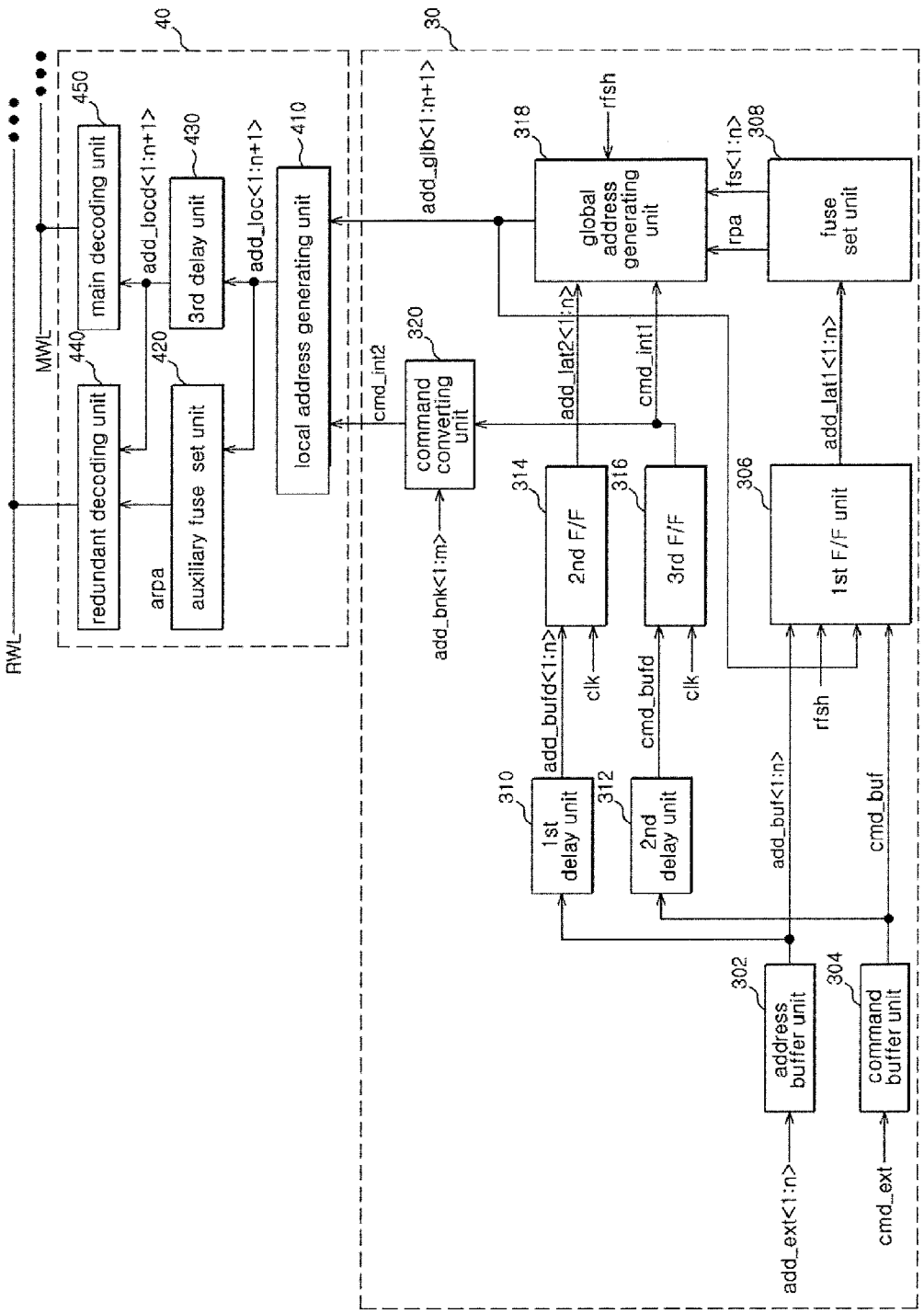
FIG. 2 is a block diagram showing a redundancy control circuit of a semiconductor memory apparatus according to the present invention.

A redundancy control circuit 500 of a semiconductor memory apparatus according to the present embodiment includes a peripheral circuit redundancy control block 30 and a memory bank redundancy control block 40 as shown in FIG. 2.

The peripheral circuit redundancy control block 30 includes an address buffer unit 302, a command buffer unit 304, a first flip-flop unit 306, a fuse set unit 308, a first delay unit 310, a second delay unit 312, a second flip-flop unit 314, a third flip-flop unit 316, a global address generating unit 318, and a command converting unit 320.

The address buffer unit 302 buffers an external address add_ext<1:n> to output a buffering address add_buf<1:n>.

The command buffer unit 304 buffers an external command cmd_ext to output a buffering command cmd_buff. The first flip-flop unit 306 receives the buffering command cmd_buf, a refresh signal rfsh, and a global address add_glb<1:n+1> to generate a first latch address add_lat1<:n>.

The fuse set unit 308 compares the first latch address add_lat<1:n> with an output signal of each fuse circuit provided therein to generate a repair determination signal rpa. The fuse set unit 308 encodes the output signal fuse_out<1:n> of each fuse circuit to output a fuse circuit signal fs<1:n>.

The first delay unit 310 delays the buffering address add_buf<1:n> by a predetermined time to generate a delay buffering address add_bufd<1:n>. The second delay unit 312 delays the buffering command cmd_buf by a predetermined time to output a delay buffering command cmd_bufd.

The second flip-flop unit 314 latches the delay buffering address add_bufd<1:n> under the control of a clock clk, and the third flip-flop unit 316 latches the delay buffering command cmd_bufd under the control of the clock clk.

The global address generating unit 318 generates the global address add_glb<1:n+1> based on a second latch address add_lat2<1:n> output from the second flip-flop unit 314 and the fuse circuit signal fs<1:n> in accordance to the repair determination signal rpa, a first internal command cmd_int1 output from the third flip-flop unit 316, and the refresh signal rfsh.

The command converting unit 320 receives a bank address add_bnk<1:m> and the first internal command cmd_int1 to generate a second internal command cmd_int2.

The memory bank redundancy control block 40 may include a local address generating unit 410, an auxiliary fuse set unit 420, a third delay unit 430, a redundant decoding unit 440, and a main decoding unit 450.

The local address generating unit 410 generates a local address add_loc<1:n+1> from the global address add_glb<1:n+1> corresponding to the input of the second internal command cmd_int2.

The auxiliary fuse set unit 420 receives the local address add_loc<1:n+1> and compares the local address add_loc<1:n+1> with output signals of a plurality of existing fuse circuits to generate a auxiliary repair determination signal arpa.

The third unit 430 delays the local address add_loc<1:n+1> by a predetermined time to output a delay local address add_locd<1:n+1>.

The redundant decoding unit 440 decodes the delay local address add_locd<1:n+1> in accordance to the control of the auxiliary repair determination signal arpa to activate any one redundancy word line RWL.

The main decoding unit 450 decodes the delay local address add_locd<1:n+1> to activate any one main word line MWL.

The "n" and "m" representing each address bit number are understood to be positive integers. The "n" may be identical to or different from the "m". In other words, the first flip-flop unit 306 and the second flip-flop 314 includes n flip-flop circuits, and the buffering address add_buf<1:n> and the delay buffering address add_bufd<1:n> are latched in each flip-flop circuit by one bit.

The external command cmd_ext is input to indicate an active mode of the semiconductor memory apparatus, and the refresh signal rfsh is generated by decoding a refresh command.

In more detail, if the buffering command cmd_buf indicates an active mode, the first flip-flop unit 306 generates the first latch address add_lat1<1:n> from the buffering address add_buf<1:n>. If the refresh signal rfsh indicates a refresh mode, the first flip-flop unit 306 generates the first latch address add_lat1<1:n> from the global address add_glb<1:n+1>.

The fuse set unit 308 includes n fuse circuits, and the n fuse circuits generate signals in accordance to the connection or disconnection of fuses that is set in a test step. The fuse set unit 308 compares output signals of the n fuse circuits with the first latch address add_lat1<1:n> by one bit to generate the repair determination signal rpa. The repair determination signal rpa provides information representing if the first latch address add_lat1<1:n> is a normal address or if it is a repair address in accordance to the potential level of the repair determination signal rpa. The fuse set unit 308 encodes the output signals of the n fuse circuits to output the fuse circuit signal fs<1:n>.

Figure 5:
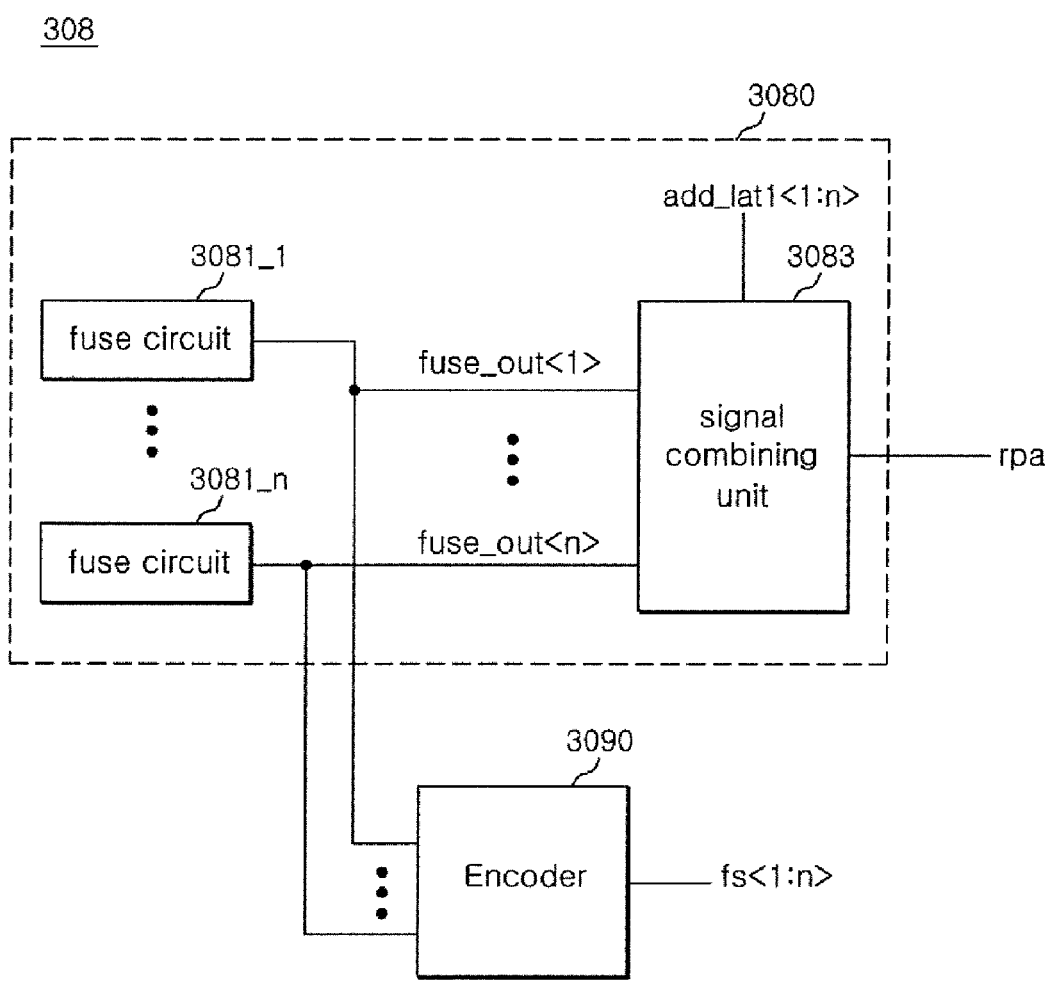
FIG. 5 is a block diagram showing a fuse set unit of FIG. 2.

As shown in FIG. 5, the fuse set unit 308 can include a repair determining unit 3080 and encoder 3090. The repair determining unit 3080 can be configured to generate the repair determination signal rpa. The repair determining unit 3080 can include a plurality of fuse circuits 3081-1 to 3081-n for generating a fuse detection signal fuse_out<1:n> and a signal combing unit 3083 for generating the repair determination signal rpa. Each of N fuse circuits 3081-1 to 3081-n can includes a same structure.

Figure 6:
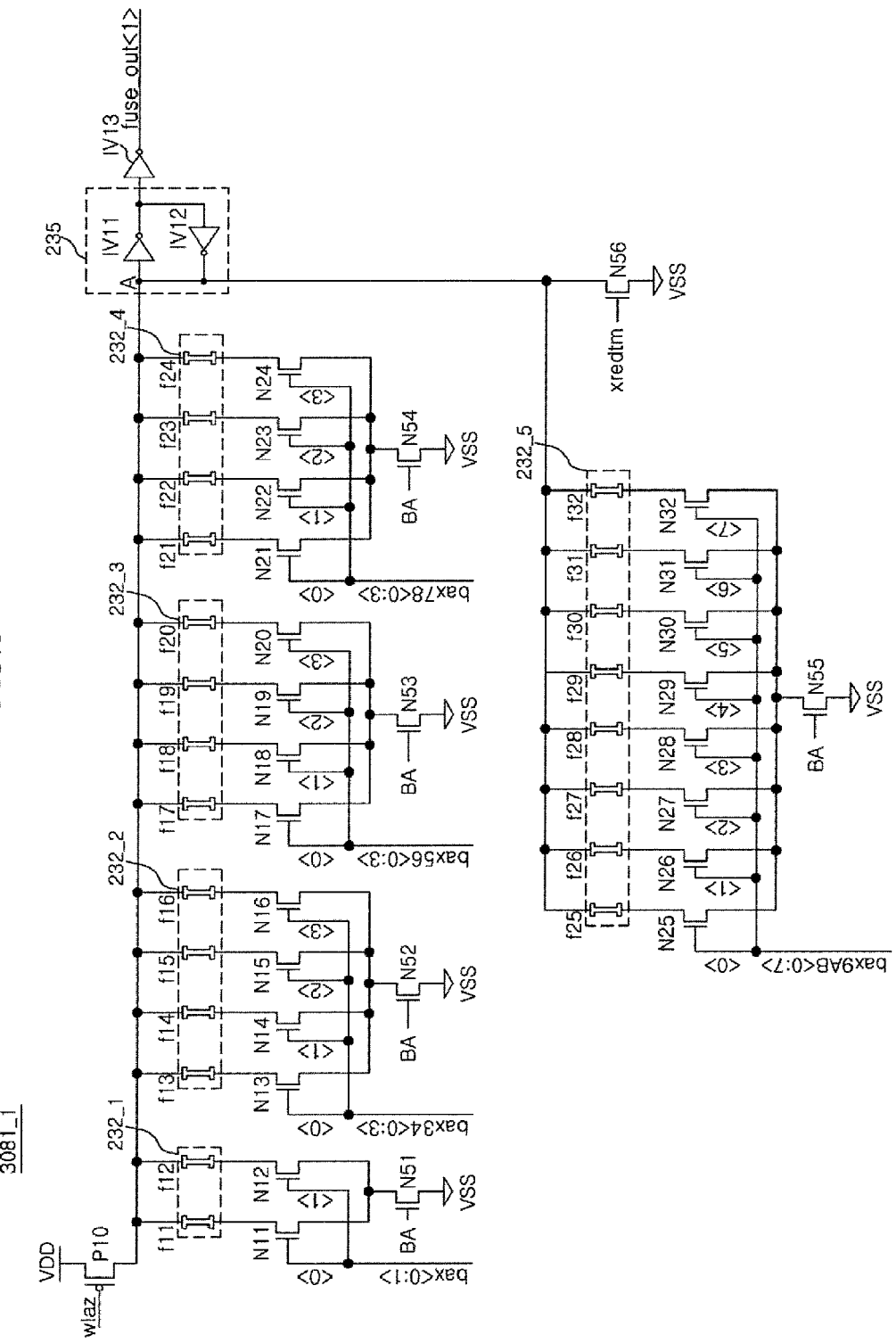
FIG. 6 is a circuit diagram of one of fuse circuits of FIG. 5.

FIG. 6 is a circuit diagram of one of the fuse circuits of FIG. 5.

As shown in FIG. 6, one of the fuse circuits 3081-1 to 3081-n, for example the first fuse circuits 3081-1 can include a plurality of fuse circuit sections 232_1 to 232_5 including a plurality of fuses f11 to f32 that are selectively cut to constitute a combination thereof corresponding to a redundant cell address. That is, only any one of the fuses of the fuse circuit section 231_1 is cut. Similarly, only any one of the fuses f11 to f32 of each of the fuse circuits 232_2 to 232_5 is cut. In this connection, provided that it is known what fuses f11 to f32 in the respective fuse circuit sections 232_1 to 232_5 have been cut, it will be possible to know a corresponding redundant cell address from the combination of those fuses f11 to f32.

First, when a precharge signal wlaz is enabled low in level, a PMOS transistor P10 is turned on, thereby causing a node A to be precharged to high in level. Then, the node A is held high in level by a latch 235 even though the precharge signal wlaz makes a low to high level transition to turn the PMOS transistor P10 off. When a bank active signal BA is enabled high in level, NMOS transistors N51 to N55 are turned on.

For example, in the case where the combination of high-level ones of decoded signals bax2<0:1>, bax34<0:3>, bax56<0:3>, bax78<0:3> and bax9AB<0:7> is applied to the first fuse circuit 3081_1 which is the same as that of cut fuses, no current path is formed between the node A and a ground terminal VSS, so the node A remains at the precharge level, or high level. In other words, for example, in the case where only the decoded signals bax2<0>, bax34<0>, bax56<0>, bax78<0> and bax9AB<0> are high in level under the condition that only the fuses f11, f13, f17, f21 and f25 are cut and the remaining fuses are not cut, no current path is formed between the node A and the ground terminal VSS, thereby causing the node A to remain at the precharge level, or high level. As a result, the fuse detection signal fuse_out<1> assumes a high level to indicate that the inputted internal address is a repaired address.

On the other hand, in the case where the combination of high-level ones of the decoded signals bax2<0:1>, bax34<0:3>, bax56<0:3> bax78<0:3> and bax9AB<0:7> is applied to the fuse circuit 3081_1 which is not the same as that of cut fuses, at least one current path is formed between the node A and the ground terminal VSS, so the node A goes low in level. In other words, for example, in the case where at least one of the decoded signals bax2<0>, bax34<0>, bax56<0>, bax78<0> and bax9AB<0> are low in level under the condition that only the fuses f11, f13, f17, f21 and f25 are cut and the remaining fuses are not cut, at least one signal other than those signals becomes high in level and at least one of NMOS transistors connected to the fuses, not cut, is thus turned on, thereby causing at least one current path to be formed between the node A and the ground terminal VSS. As a result, the node A becomes low in level and the fuse detection signal fuse_out<1> thus assumes a low level to indicate that the inputted internal address is a normal address, because it does not correspond to a redundant cell address.

The signal combining unit 3083 is configured to receive the fuse detection signals fuse_out <1:n> and the first latch address add_lat<1:n> corresponding to the fuse detection signals fuse_out<1:n>, compare the fuse detection signals fuse_out <1:n> with the first latch address add_lat<1:n>, respectively, and output a comparing result as the repair determination signal rpa. The signal combining unit can include a conventional comparing circuit.

Figure 7:
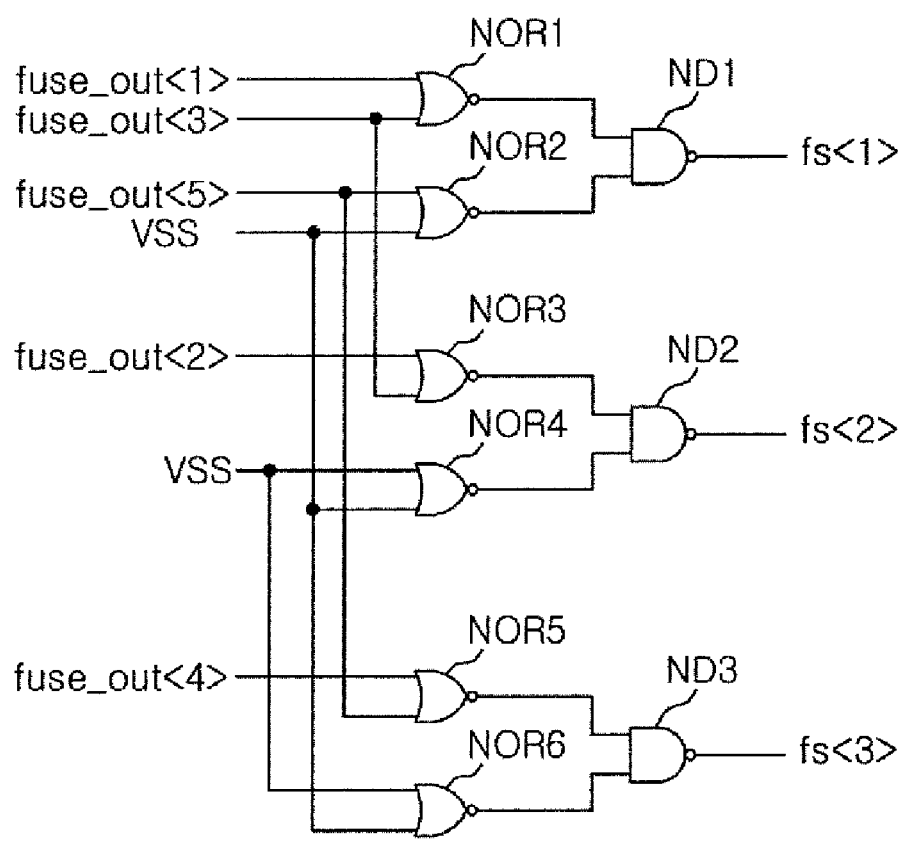
FIG. 7 is a logical circuit diagram showing an encoder of FIG. 5.

As shown FIG. 7, the encoder 3090 comprises a plurality of NOR gates NOR1 to NOR 6 and a plurality of NAND gates ND 1 to ND 3. The encoder 3090 of the FIG. 7 is circuit diagram f if n of the fuse_out<1:n> is 5. The first NOR gate NOR 1 receives the first fuse detection signal fuse_out<0> and the third fuse detection signal fuse <3>. The second NOR gate NOR 2 receives the fifth fuse detection signal fuse_out<5> and the ground voltage VSS. The third NOR gate NOR 3 receives the second fuse detection signal fuse_out<2> and the third fuse detection signal fuse <3>. The first NOR gate NOR 1 receives the first fuse detection signal fuse_out<0> and the third fuse detection signal fuse <3>. The fourth NOR gate NOR 4 and the sixth NOR gate NOR 6 include two input terminals and receive the ground voltage through the two input terminals. The fifth NOR gate NOR 5 receives the fourth fuse detection signal fuse_out<4> and the fifth fuse detection signal fuse <5>.

The first NAND gate ND1 receives output signals of the first and the second NOR gates NOR 1 and NOR 2 thereby generating a first fuse circuit signal fs<1>. The second NAND gate ND2 receives output signals of the third and the fourth NOR gates NOR3 and NOR 4 thereby generating a second fuse circuit signal fs<2>. The third NAND gate ND3 receives output signals of the fifth and the sixth NOR gates NOR 5 and NOR 6 thereby generating a third fuse circuit signal fs<3>.

Consequently, if at least one of the fuse detection signals fuse_out<0:5>, which are the output signals from the fuse circuits 3081_1 to 3081_n, assumes a high level, the internal address inputted to the semiconductor device is determined to be a repaired address.

If the repair determination signal rpa is disabled, and the first internal command cmd_int1 indicates an active mode, the global address generating unit 318 combines the second latch address add_lat2<1:n> and the repair determination signal rpa to generate the global address add_glb<1:n+1>. In addition, the global address generating unit 318 is provided therein with a refresh counter. If the repair determination signal rpa is disabled, and the refresh signal rfsh indicates a refresh mode, the global address generating unit 318 combines an address from the refresh counter and the repair determination signal rpa to generate the global address add_glb<1:n+1>. The global address add_glb<1:n+1> has a bit number more than that of the second latch address add_lat2<1:n> by one bit, and the additional bit contains information about a repair state of the repair determination signal rpa. In other words, the global address generating unit 318 delivers the information about the repair state to the memory bank through one bit (e.g., the most significant bit) of the global address add_glb<1:n+1>.

The command converting unit 320 converts the first internal command cmd_int1 into the second internal command cmd_int2, and delivers the second internal command cmd_int2 to a memory bank indicated by the bank address add_bnk<1:m>.

The plural memory bank redundancy control blocks 40 are provided corresponding to the number of memory banks. The second internal command cmd_int2 indicates the operation of any one of the local address generating units 410 provided in the plural memory bank redundancy control blocks 40, and the local address generating unit 410 selected by the second internal command cmd_int2 receives the global address add_glb<1:n+1> to generate the local address add_loc<1:n+1>.

The auxiliary fuse set unit 420 replaces a redundancy memory cell with another memory cell when the redundancy memory cell is found to be defective. The auxiliary fuse set unit 420 includes a plurality of fuse circuits, and the number of the fuse circuits is smaller than the number of fuse circuits of the fuse set unit 308 of the peripheral circuit redundancy control block 30. The auxiliary fuse set unit 420 compares output signals thereof with the local address add_loc<1:n+1>, and enables the auxiliary repair determination signal arpa when a redundancy word line RWL is replaced with another redundancy word line RWL. As described above, since the auxiliary fuse set unit 420 includes less fuse circuits than those of the fuse set unit 308, the loss of an area margin derived from the auxiliary fuse set unit 420 is reduced.

The third delay unit 430 is provided to synchronize timing, to input the local address add_loc<1:n+1> to the redundant decoding unit 440 and the main decoding unit 450, with timing to input the auxiliary repair determination signal arpa to the redundant decoding unit 440.

When the auxiliary repair determination signal arpa is disabled, and a preset one bit of the local address add_loc<1:n+1> indicates a repair operation, the redundant decoding unit 440 activates any one redundancy word line RWL based on the local address add_loc<1:n+1>. If the auxiliary repair determination signal arpa is enabled, any one redundancy word line RWL is activated corresponding to the enable of the auxiliary repair determination signal arpa.

If a preset one bit of the local address add_loc<1:n+1> indicates a normal operation, then the main decoding unit 450 decodes the local address add_loc<1:n+1> to activate any one main word line MWL.

In the redundancy control circuit of the semiconductor memory apparatus of the present invention, the fuse set unit 308 is provided in the peripheral circuit redundancy control block 30 so that an available area of the memory bank is enlarged. Accordingly, an area margin is increased. In addition, any one bit of the global address add_glb<1:n+1> represents all information about the memory bank such that the memory bank has a repair mode and a normal mode. Accordingly, the bit number of the global address add_glb<1:n+1> may be increased.

Figure 3:
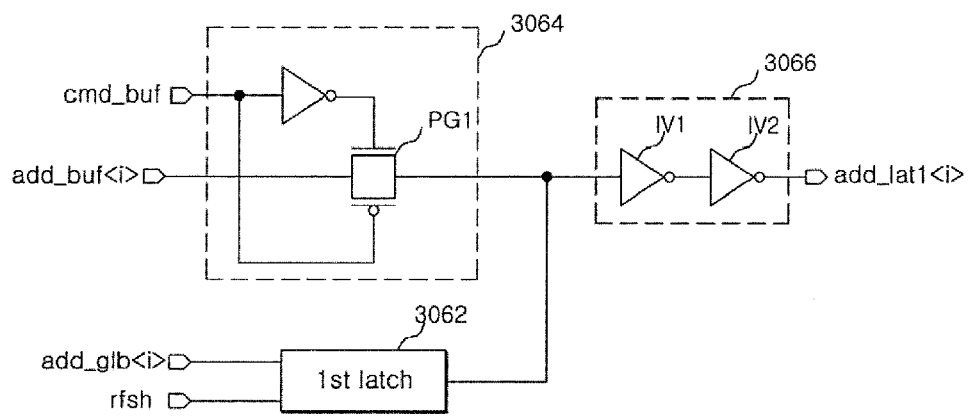
FIG. 3 is a logical circuit diagram showing a first flip-flop unit of FIG. 2.

FIG. 3 is a logical circuit diagram showing a detailed structure of the first flip-flop unit 306 of FIG. 2, and showing one flip-flop circuit to latch one bit address. The first flip-flop unit 306 of the invention includes n flip-flop circuits.

The first flip-flop unit 306 includes a first latch 3062, a first switch 3064, and a first driving unit 3066. The first latch 3062 latches one bit global address add_glb<i> if the refresh signal rfsh is enabled. The first switch 3064 passes one bit buffering address add_buf<i> under the control of the buffering command cmd_buf. The first driving unit 3066 non-inverts a signal from the first latch 3062 or the first switch 3064 to output one-bit first latch address add_lat1<i>.

The first switch 3064 includes a first pass gate PG1 passing one bit buffering address add_buf<i> when the potential of the buffering command cmd_buf is at a low level. The buffering command cmd_buf is a low enable signal.

The first driving unit 3066 includes first and second inverters, IV1 and IV2, non-inverting the signal from the first latch 3062 or the first switch 3064.

When the semiconductor memory apparatus is in a refresh mode, the refresh signal rfsh is enabled, and one-bit global address add_glb<i> is latched to the first latch 3062. Thereafter, the output signal of the first latch 3062 is output as the one-bit first latch address add_lat1<i> through the first driving unit 3066.

Meanwhile, when the semiconductor memory apparatus is in an active mode, the buffering command cmd_buff is enabled. At this time, one-bit buffering address add_buf<i> is delivered to the first driving unit 3066 through the first pass gate PG1 of the first switch 3064. Thereafter, the first driving unit 3066 drives the signal delivered from the first switch 3064 to output the one-bit first latch address add_lat1<i>.

Figure 4:
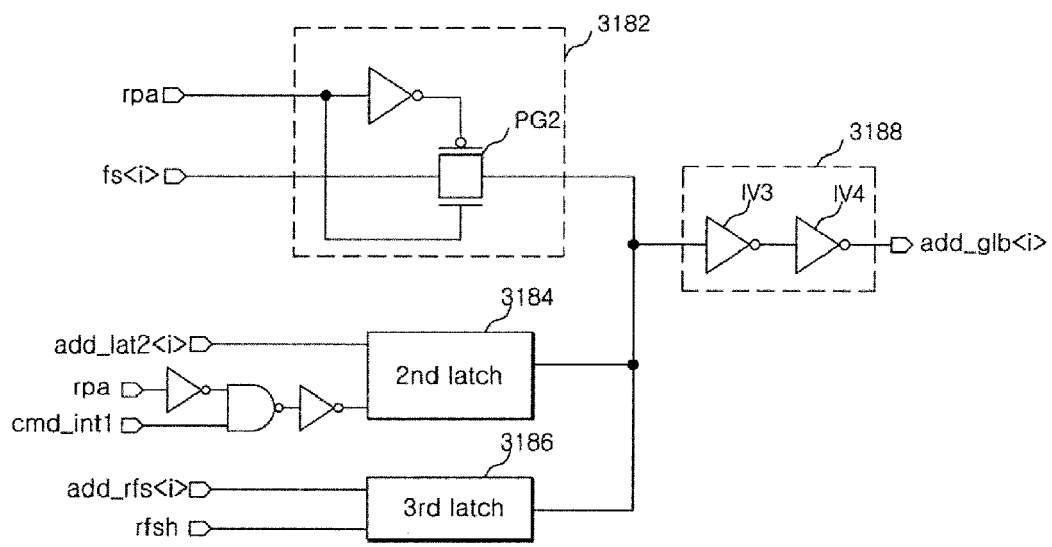
FIG. 4 is a logical circuit diagram showing a global address generating unit of FIG. 2.

FIG. 4 is a logical circuit diagram showing a detailed structure of the global address generating unit 318 of FIG. 2, and showing only a circuit generating one-bit global address. Although not shown, a refresh address add_rfs<i> shown in FIG. 4 is applied from a refresh counter. The global address generating unit 318 combines a plurality of global addresses add_glb<i> with the repair determination signal rpa to output the global address add_glb<1:n+1> having (n+1) bits through an output terminal.

The global address generating unit 318 includes a second switch 3182, a second latch 3184, a third latch 3186, and a second driving unit 3188. The second switch 3182 passes one-bit fuse circuit signal fs<i> if the repair determination signal rpa is enabled. The second latch 3184 latches one-bit second latch address add_lat2<i> if the repair determination signal rpa is disabled, and if the first internal command cmd_int1 is enabled. The third latch 3186 latches one-bit refresh address add_rfs<i> if the repair determination signal rpa is disabled, and if the refresh signal rfsh is enabled. The second driving unit 3188 non-invert a signal from the second switch 3182, the second latch 3184, and the third latch 3186 to output one-bit global address add_glb<i>.

The second switch 3182 includes a second pass gate PG2, and the second driving unit 3188 includes third and fourth inverters IV3 and IV4 connected to each other in series.

The global address generating unit 318 having the above structure outputs one-bit fuse circuit signal fs<i> as the one-bit global address add_glb<i> if the repair determination signal rpa is enabled. The global address generating unit 318 outputs the one-bit second latch address add_lat2<i> as the one-bit global address add_glb<i> if the first internal command cmd_int1 is enabled in a state where the repair determination signal rpa is disabled. In addition, the global address generating unit 318 outputs one-bit refresh address add_rfs<i> as the one-bit global address add_glb<i> if the refresh signal rfsh is enabled in a state when the repair determination signal rpa is disabled.

The output terminal of the global address generating unit 318 combines the global address add_glb<1:n>, delivered through the above process, with the repair determination signal rpa to output the global address add_glb<1:n+1> having (n+1) bits. Accordingly, the global address add_glb<1:n+1> transmitted to the memory bank redundancy control block 40 contains information about a repair operation state.

As described above, in the redundancy control circuit of the semiconductor memory apparatus of the present invention, the fuse set unit 308 is provided in the peripheral circuit redundancy control block 30 to make available an enlarged area of the memory bank by increasing the area margin. To this end, the global address generating unit 318 is provided in the peripheral circuit redundancy control block 30 to generate the global address add_glb<n+1> in which one bit of the global address add_glb<1:n+1> contains information about a repair state.

Although the auxiliary fuse set unit 420 is provided in the memory bank redundancy control block 40, the auxiliary fuse set unit 420 is only used for the replacement of the redundancy word line RWL. Accordingly, the area occupied by the fuse set unit 308 is much smaller than that of a fuse set unit provided in a conventional memory bank. Accordingly, the available area of the memory bank can be increased, and the high integration of the semiconductor memory apparatus can be more easily realized by implementing the present invention.

In the redundancy control circuit of the semiconductor memory apparatus and the method thereof according to the present invention, the fuse set unit is provided in the peripheral circuit redundancy control block, and an available area of a memory bank area is enlarged, so that an area margin can be enhanced.

While the present invention has been described with respect to the particular embodiments, it will be apparent to those skilled in the art that various changes and modifications may be made without departing from the spirit and scope of the invention as defined in the following claims.

What is claimed is:

1. A circuit for controlling redundancy in a semiconductor memory apparatus, the circuit comprising:
   a peripheral circuit redundancy control block configured to generate a global address; and
   a memory bank redundancy control block which receives the global address corresponding to a second internal command to selectively activate a redundancy word line or a main word line,
   wherein the peripheral circuit redundancy control block includes:
      a first flip-flop unit which receives a buffering address, a buffering command, a refresh signal, and the global address to generate a first latch address;
      a fuse set unit which compares the first latch address with an output signal of each fuse circuit provided therein to generate a repair determination signal;
      a second flip-flop unit which latches a delay buffering address in accordance to a clock;
      a third flip-flop unit which latches a delay buffering command in accordance to the clock to generate a first internal command;
      a global address generating unit which receives a second latch address and the output signal of each fuse circuit of the fuse set unit to generate the global address in accordance to the repair determination signal, the first internal command, and the refresh signal; and a command converting unit which receives a bank address and the first internal command to generate the second internal command.

2. The circuit of claim 1, wherein the global address includes information about a repair operation.

3. The circuit of claim 1, wherein the peripheral circuit redundancy control block further comprises:
an address buffer which buffers an external address to output the buffering address; and
a command buffer which buffers an external command to output the buffering command.

4. The circuit of claim 1, wherein the peripheral circuit redundancy control block further comprises:
a first delay unit which delays the buffering address by a predetermined time to output the delay buffering address; and
a second delay unit which delays the buffering command by a predetermined time to output the delay buffering command.

5. The circuit of claim 1, wherein the first flip-flop unit includes flip-flop circuits corresponding to a bit number of the buffering address, and wherein
each flip-flop circuit includes:
a latch which latches one bit of the global address when the refresh signal is enabled;
a switch which passes one bit of the buffering address in accordance to the buffering command; and
a driving unit which non-inverts a signal delivered from the latch or the switch to output one bit of the first latch address.

6. The circuit of claim 1, wherein the global address generating unit includes:
a switch which passes one bit of the output signal of the fuse circuit of the fuse set unit when the repair determination signal is enabled;
a first latch which latches one bit of the second latch address when the repair determination signal is disabled and when the first internal command is enabled;
a second latch which latches one bit of a refresh address when the repair determination signal is disabled and when the refresh signal is enabled; and
a driving unit which non-inverts a signal output from the switch, the first latch, and the second latch to output one bit of the global address.

7. The circuit of claim 1, wherein the memory bank redundancy control block includes:
a local address generating unit which generates a local address based on the global address corresponding to an input of the second internal command;
an auxiliary fuse set unit which receives the local address, compares the local address with an output signal of a plurality of fuse circuits to generate an auxiliary repair determination signal;
a third delay unit which delays the local address by a predetermined time to output a delay local address;
a redundant decoding unit which decodes the delay local address in accordance to the auxiliary repair determination signal to activate any one redundancy word line; and
a main decoding unit which decodes the delay local address to activate any one main word line.

8. The circuit of claim 7, wherein the auxiliary fuse set unit compares information of replacement of a defected redundancy word line with the local address to generate the auxiliary repair determination signal.

9. The circuit of claim 1, wherein the fuse set unit includes:
a plurality of fuse circuits configured to generate a plurality of fuse detecting signals according to cuttings of a plurality of fuses formed therein;
a signal combining unit configured to receive the plurality of fuse detecting signals and compare the each of the fuse detecting signal with the first latch address corresponding to the fuse detecting signals thereby generating the repair determination signal; and
an encoder configured to receive the plurality of the fuse detecting signals and generate a plurality of fuse signals as the output signals of the fuse circuits.

10. A circuit for controlling redundancy in a semiconductor memory apparatus, the circuit comprising:
a fuse set unit configured to generate a plurality of output fuse circuit signals, wherein the fuse set unit compares a first latch address, which is obtained by buffering and latching an external address, with each output fuse circuit signal to generate a repair determination signal;
a global address generating unit which receives a second latch address, which is obtained by buffering and latching the external address, and the each output fuse circuit signal of the fuse set unit to generate a global address based on the repair determination signal, a first internal command, and a refresh signal;
a local address generating unit which generates a local address from the global address corresponding to a second internal command;
a redundant decoding unit which activates a redundancy word line in accordance to indication of the local address; and
a main decoding unit which activates a main word line in accordance to the indication of the local address.

11. The circuit of claim 10, wherein the global address includes information about a repair operation state.

12. The circuit of claim 10, wherein the fuse set unit and the global address generating unit are provided in a peripheral circuit area, and wherein the local address generating unit, the redundant decoding unit, and the main decoding unit are provided in a memory bank area.

13. The circuit of claim 10, wherein the global address generating unit includes:
a switch which passes one bit of the output fuse circuit signal of the fuse set unit when the repair determination signal is enabled;
a first latch which latches one bit of the second latch address when the repair determination signal is disabled and when the first internal command is enabled;
a second latch which latches one bit of a refresh address when the repair determination signal is disabled and when the refresh signal is enabled; and
a driving unit which non-inverts a signal output from the switch, the first latch, and the second latch to output one bit of the global address.

14. The circuit of claim 10, further comprising an auxiliary fuse set unit which receives the local address and compares the local address with the output fuse circuit signal to generate an auxiliary repair determination signal, the auxiliary fuse set unit comparing information of replacement of a defected redundancy word line with the local address to generate the auxiliary repair determination signal.

15. The circuit of claim 10, wherein the fuse set unit includes:
a plurality of fuse circuits configured to generate a plurality of fuse detecting signals according to cuttings of a plurality of fuses formed therein;

a signal combining unit configured to receive the plurality of fuse detecting signals and compare the each of the fuse detecting signal with the first latch address corresponding to the fuse detecting signals, thereby generating the repair determination signal; and an encoder configured to receive the plurality of the fuse detecting signals and generate the plurality of output fuse circuit signals.

* * * * *